United States Patent [19]
Mohri

[11] Patent Number: 5,994,899
[45] Date of Patent: Nov. 30, 1999

[54] ASYMMETRICAL MAGNETO-IMPEDANCE ELEMENT HAVING A THIN MAGNETIC WIRE WITH A SPIRAL MAGNETIC ANISOTROPY

[75] Inventor: Kaneo Mohri, Nagoya, Japan

[73] Assignee: Research Development Corporation of Japan, Japan

[21] Appl. No.: 08/623,812

[22] Filed: Mar. 29, 1996

[30] Foreign Application Priority Data

Sep. 14, 1995 [JP] Japan .................................. 7-236317

[51] Int. Cl.⁶ .......................... G01R 33/02; G11B 5/127; H01F 1/153
[52] U.S. Cl. ...................... 324/260; 324/117 R; 324/244; 360/110
[58] Field of Search ............................... 324/207.13, 244, 324/249, 252, 260, 117 R; 360/110, 115

[56] References Cited

U.S. PATENT DOCUMENTS

| | | |
|---|---|---|
| 4,247,601 | 1/1981 | Wiegand . |
| 4,785,244 | 11/1988 | Jin et al. .................................. 324/260 |
| 5,298,689 | 3/1994 | Mohri et al. .................... 324/207.13 X |
| 5,734,267 | 3/1998 | Senda et al. ........................ 324/260 X |

FOREIGN PATENT DOCUMENTS 7-181239  7/1995  Japan ..................................... 324/249

OTHER PUBLICATIONS

Uchiyama et al; "Colpitts oscillator type . . . using . . . MI elements", Japan Applied Magnetic Society Academic Lecture Abstracts, 1994 (no month).

Noda et al; "Magneto–Impedance Effect . . . Asymmetrical Current", Journal of the Magnetics Society of Japan vol. 19 No. 2, 1995 (no month).

T. Kitoh et al, Asymmetrical Magneto–Impedance Effects Twisted Amorphous Wires for Sensitive Magnetic Sensors, IEEE Transactions on Magnetics, vol. 31, No. 6, Nov. 1995; pp. 3137–3139.

Primary Examiner—Gerard Strecker
Attorney, Agent, or Firm—Lorusso & Loud

[57] ABSTRACT

A magneto-impedance element includes an amorphous wire having a spiral magnetic anisotropy. A dc-biased alternating current is supplied to the amorphous wire, whereby a voltage is produced between both ends of the amorphous wire. The amplitude of the voltage varies asymmetrically with a variation in an externally applied magnetic field. The magneto-impedance element is compact, and has a high sensitivity and a high response speed.

6 Claims, 5 Drawing Sheets

ASYMMETRICAL MAGNETO-IMPEDANCE ELEMENT HAVING A THIN MAGNETIC WIRE WITH A SPIRAL MAGNETIC ANISOTROPY

BACKGROUND OF THE INVENTION

1. Field of the Invention

The present invention relates to a magneto-impedance element and a method of manufacturing the same. The magneto-impedance element serves as a magnetic head which is used for magnetic storage and magnetic recording in a computer, an information machine, etc., and is also used in control of drive apparatuses therefor. The magneto-impedance element also serves as a magnetic sensor head for detecting magnetic fields, currents, and the like.

The present invention also relates to a method and apparatus for magnetic sensing using a magneto-impedance element.

The present invention is applicable to many fields such as computers, information machines, information home appliances, mechatoronics, power electronics, medical electronics, industrial instrumentation such as non-destructive inspection, environmental measurement, and scientific measurement utilizing terrestrial field or rock magnetism.

Specifically, the present invention is applicable to all industrial fields in which Hall elements, magneto-resistance (MR) elements, and flux gate sensors are currently utilized, because the magneto-impedance element can be miniaturized to the same degree as Hall elements and MR elements, and the sensitivity in detecting magnetic fields is 100 fold or more compared to Hall elements and MR elements, i.e., comparable to that of flux gate sensors for detection of a uniform field. Therefore, in these areas, the present invention contributes to giving intelligence to measurement and control.

2. Description of the Related Art

The present inventors have proposed such a magneto-impedance element, as disclosed in Japanese Patent Application Laid-Open (kokai) No. 7-181239 entitled "Magneto-Impedance Effect Element".

The element disclosed in the publication is a slender magnetic element which is made of zero-magnetostriction amorphous wire or the like and whose circumferential permeability $\mu$ is high. When a high frequency current is caused to flow through the element, an AC voltage appears between both ends thereof, and the amplitude of the AC voltage sensitively varies in response to a magnetic field applied externally in the longitudinal direction of the element. In detail, when the circumferential permeability $\mu$ changes due to an external magnetic field, the impedance Z of the element changes due to a skin effect while maintaining the relationship $|Z| \propto \sqrt{\mu}$ (the impedance decreases at a relatively low frequency, and increases at a high frequency). Therefore, the above-described element is called a "magneto-impedance element" or an MI element.

In the case where an amorphous wire of FeCoSiB which has been drawn and tension annealed so as to have a diameter of 30 $\mu$m and a length of 1 mm is prepared as an MI element and a current of 5 mA having a frequency of 1 MHz is supplied to the MI element, the impedance $|Z|$ of the MI element decreases by about 50% when an external magnetic field $H_{ex}$ of 5 Oe is applied (i.e., 10% decrease per Oe). Therefore, the MI element has a sensitivity about 100 times that of a conventional MR element (the resistance variation ratio of an MR element is about 0.1% per Oe), although the size is as small as the MR element. This means that the MI element is a micro magnetic element having a super high sensitivity. However, the impedance $|Z|$ symmetrically varies depending on the absolute value of an external magnetic field $H_{ex}$ and does not depend on the sign of the external magnetic field $H_{ex}$. For this reason, as in the case of an MR element, the MI element cannot form a linear magnetic sensor as is.

To overcome this problem, two MI elements are used and opposite bias magnetic fields are applied to these elements. By detecting the difference between the output voltages of the two elements, a magnetic field can be detected with high sensitivity. Therefore, a highly sensitive magnetic sensor can be obtained which has a resolution of $10_{-5}$ Oe and which has a sensitivity comparable to a flux gate sensor for a uniform magnetic field. Since the head length of the MI element can be shorted to about 1 mm, the MI element can detect a local magnetic field with considerably high sensitivity. When a resonant type multivibrator is formed by combining an MI element and a bipolar transistor or an FET, oscillation of 100 MHz–200 MHz can be easily obtained. Therefore, in the case of an amplitude modulation type magnetic sensor, a super high response speed is obtained because of a very high cut-off frequency of about 10 MHz. The cut-off frequency of a flux gate sensor is about 1 kHz.

As described above, the MI element is a basic element for constituting a micro magnetic sensor having a super high sensitivity and a super high response speed. However, the MI element has drawbacks which must be resolved. One of such drawbacks is a manner of applying bias magnetic fields. Conventionally, the following three methods have been used for applying a DC bias magnetic field:

(i) a coil is wound around a head, and a direct current is supplied to the coil;

(ii) a permanent magnet is disposed in the vicinity of a head; and (iii) a coil is wound around a soft magnetic material having a rectangular BH characteristic, and a direct current is supplied to the coil, whereby a DC magnetic field generated from magnetic poles of the soft magnetic material is applied to the head.

However, these methods prevent the MI element from being manufactured in a micro size, and make the adjustment troublesome. Additionally adjustment of a long wire head having a length of a few tens of centimeters to detect a large current, is quite troublesome.

SUMMARY OF THE INVENTION

An object of the present invention is to solve the above-mentioned problems in the conventional magneto-impedance element and to provide a novel magneto-impedance element which has a reduced size, and which has a high sensitivity and a high response speed.

Another object of the present invention is to provide a method of manufacturing the magneto-impedance element set forth above.

Still another object of the present invention is to provide a method and apparatus for magnetic sensing using the magneto-impedance element set forth above.

To achieve the above objects, the present invention provides a magneto-impedance element comprising a thin magnetic material which has a spiral magnetic anisotropy and to which a dc-biased alternating current is supplied. The amplitude of a voltage produced across the thin magnetic material varies asymmetrically with a variation in an externally applied magnetic field. The dc-biased alternating current may be a dc-biased high frequency current or a dc-biased pulse current.

Since the above-described structure eliminates the necessity of means for applying a bias magnetic field, it is possible to provide a small-sized magneto-impedance element which has a high sensitivity and a high response speed.

Preferably, the thin magnetic material is an amorphous magnetic material. In this case, since the amorphous magnetic material has a high electrical resistivity, the impedance can be increased and the size of the magneto-impedance element can be decreased. In addition, the magneto-impedance element has a higher sensitivity to externally applied magnetic fields. More preferably, the amorphous magnetic material is an amorphous wire having a diameter equal to or less than 100 μm. In this case, the size of the magneto-impedance element can be decreased further.

The present invention also provides a method of manufacturing a magneto-impedance element. This method includes the steps of drawing a magnetic material having a magnetic anisotropy in the circumferential direction thereof so as to obtain a thin wire; annealing the wire while applying a tension thereto; twisting the wire; and fixing both ends of the wire to electrodes.

Alternatively, the method includes the steps of drawing a magnetic material having a magnetic anisotropy in the circumferential direction thereof so as to obtain a thin wire; annealing the wire in a state in which the wire is twisted; and fixing both ends of the wire to electrodes.

When these methods are used, a small-sized magneto-impedance element having a high sensitivity and a high response speed can be easily manufactured.

In these methods, the magnetic material may be an amorphous wire having a composition of CoSiB or an amorphous wire having a composition of FeCoSiB.

Moreover, the present invention provides a method and apparatus for magnetic sensing. A thin magnetic material having a spiral magnetic anisotropy is provided. A dc-biased alternating current is supplied from a current supply source to the thin magnetic material. As a result, a voltage is produced across the thin magnetic material, and the amplitude of the voltage varies asymmetrically with a variation in an externally applied magnetic field. The dc-biased alternating current may be a dc-biased high frequency current or a dc-biased pulse current.

Since the above-described structure eliminates the necessity of means for applying a bias magnetic field, it is possible to provide a small-sized magneto-impedance element which has a high sensitivity and a high response speed.

DETAILED DESCRIPTION OF THE PREFERRED EMBODIMENTS

Embodiments of the present invention will now be described with reference to the accompanying drawings.

Figure 1:
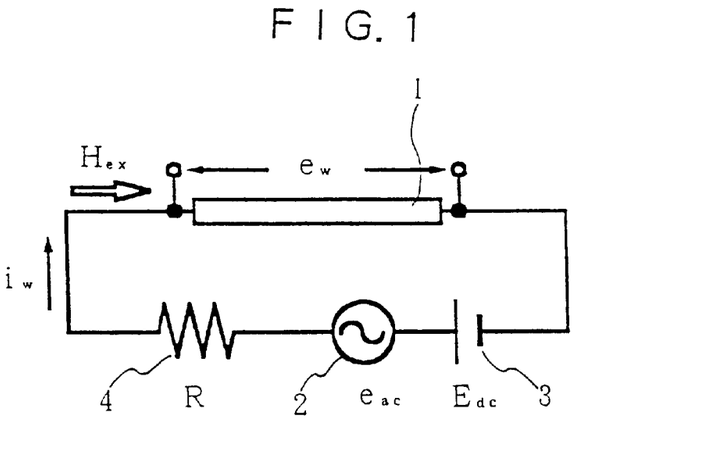
FIG. 1 is a circuit diagram showing the structure of a magnetic sensing apparatus in which a magneto-impedance (MI) element according to the present invention is utilized.

FIG. 1 shows the structure of a magnetic sensing apparatus in which a magneto-impedance element according to the present invention is utilized.

In FIG. 1, numeral 1 denotes an MI element which is formed of a magnetic material (amorphous wire) having a spiral magnetic anisotropy caused by twisting stress. Numeral 2 denotes a high frequency power supply ($e_{ac}$), numeral 3 denotes a DC power supply ($E_{dc}$), and numeral 4 denotes a resistor (R). Symbol $H_{ex}$ denotes an externally applied magnetic field. A dc-biased alternating current $i_w$ is supplied to the MI element 1 so as to excite it, so that an output voltage $e_w$ is produced between opposite ends of the MI element 1.

Figure 2:
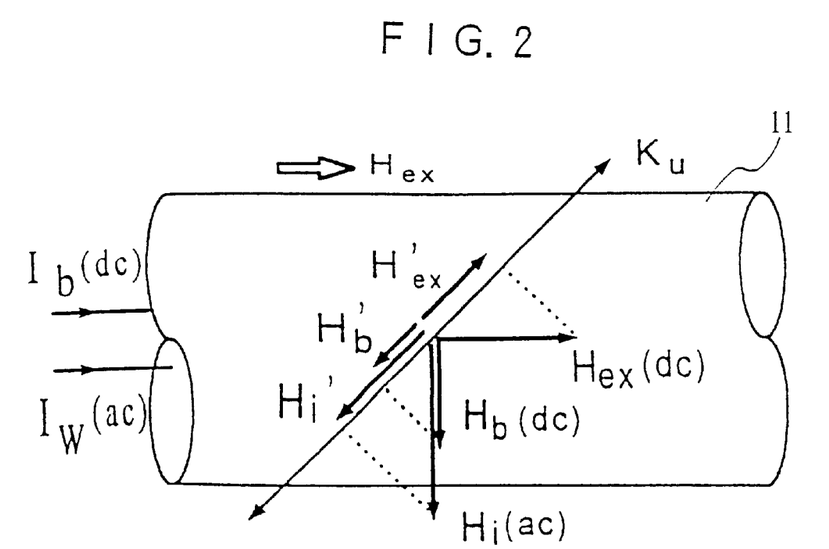
FIG. 2 is an explanatory chart showing a magnetic effect of a twisted amorphous wire serving as the MI element according to the present invention.

FIG. 2 shows a magnetic effect of the MI element according to the present invention.

In FIG. 2, numeral 11 denotes a twisted amorphous wire serving as the MI element, symbol $I_b$(dc) denotes a direct current supplied to the twisted amorphous wire 11, and symbol $I_w$(ac) denotes a high frequency current supplied to the twisted amorphous wire 11. Symbol $H_{ex}$ (dc) denotes an externally applied magnetic field, symbol Ku denotes the direction of the magnetic anisotropy, symbol $H'_{ex}$ denotes a component of $H_{ex}$ in the direction Ku, symbol $H_b$(dc) denotes a circumferential bias magnetic field produced by the direct current $I_b$(dc), symbol $H'_b$ denotes a component of $H_b$(dc) in the direction Ku, symbol $H_f$(ac) denotes a circumferential exciting magnetic field produced by the $I_w$(ac), and symbol $H'_i$ denotes a component of $H_f$(ac) in the direction Ku.

When an amorphous wire is used as the MI element of the present invention, a twisting stress is applied to the wire, so that a spiral magnetic anisotropy is induced in the surface layer of the wire due to the inverse magnetostrictive effect such that the direction of spiral magnetic anisotropy is inclined at ±45° with respect to the axial direction of the wire. A direct current is supplied to the amorphous wire so as to generate a bias magnetic field.

When the spiral anisotropic component $H_\theta/\sqrt{2}$ of the circumferential magnetic field $H_{74}=I_{dc}2\pi a$ (a: radius of the wire) produced by the direct current $I_{dc}$ is combined with the spiral anisotropic component $H_{ex}/\sqrt{2}$ of an externally applied magnetic field $H_{ex}$, the combined magnetic field becomes a DC magnetic field. Therefore, the amplitude E of an output voltage caused by the high frequency current $i_{ac}$ varies asymmetrically with the externally applied magnetic field $H_{ex}$ when a direct current $I_{dc}$ is supplied to the wire.

Accordingly, when two twisted amorphous wires (MI elements) are disposed in parallel to each other, and a direct current $I_{dc}$ is applied to the wires in opposite directions, the twisted amorphous wires serve as a magnetic sensor.

Since the sensitivity of the sensor can be adjusted by adjusting the direct current $I_{dc}$, a sensitive magnetic sensor having a variable gain can be provided without disposing a coil or a magnet for the sensor (micro head). Especially, when the micro head has an elongated shape for surrounding a conductive wire, as in a sensor head for detecting a large current, the biasing by a direct current is quite effective. In addition, costs of the sensor can be greatly lowered.

When the magnitude of the direct current $I_{dc}$ is equal to the amplitude of the high frequency current $i_{ac}$, the micro head operates in a manner equivalent to the case in which a half-wave rectified current is applied to the head. In a multivibrator oscillating circuit consisting of two twisted amorphous wires (MI elements) and two transistors (see FIG. 5), since half-wave rectified current flows through each of the MI elements, it is unnecessary to separately apply a direct current $I_{dc}$ to the MI elements. Therefore, it is possible to provide a magnetic sensor which has a high sensitivity and a high response speed and which can be operated stably by using a single DC voltage source.

Embodiment 1

Figure 3A:
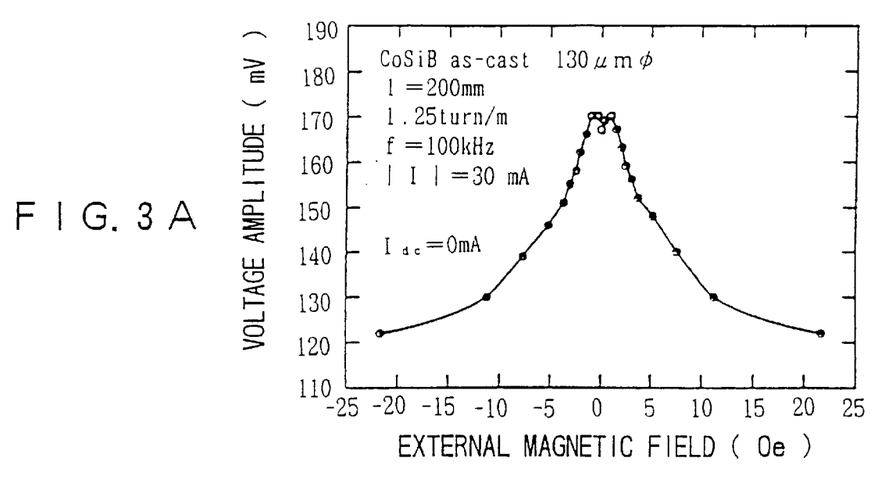
FIGS. 3A–3C are graphs showing the characteristics of an MI element used in a first embodiment of the present invention, in each of which the relationship between an externally applied magnetic field and the amplitude of an output voltage is shown.
Figure 3B:
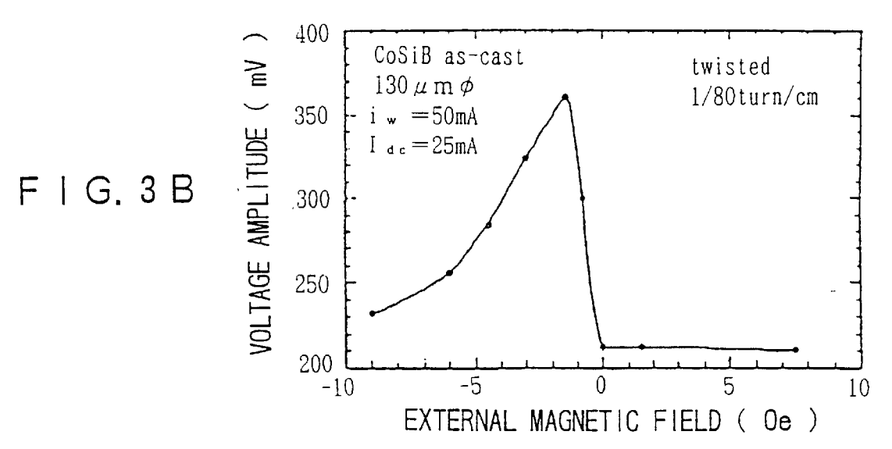
Figure 3C:
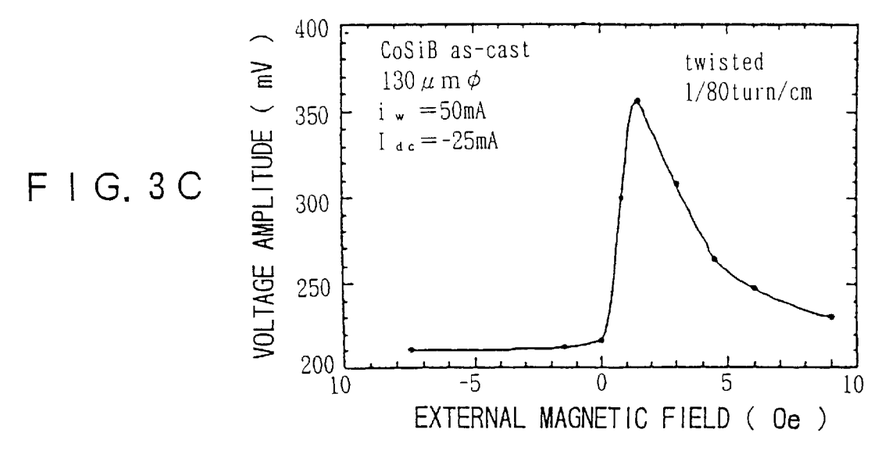

FIGS. 3A–3C show the characteristics of a magneto-impedance element used in a first embodiment of the present invention, in each of which the relationship between an externally applied magnetic field and the amplitude of an output voltage is shown. A $Co_{72.5}Si_{12.5}B_{15.0}$ amorphous wire having a length of 20 cm and a diameter of 130 $\mu$m was twisted 5/4 turns per meter, and both ends of the wire were fixed to electrodes. When a current of 50 mA having a frequency of 100 kHz was applied to the amorphous wire, the amplitude E of an output voltage produced across the amorphous wire varied as shown in FIGS. 3A–3C with variations in an externally applied magnetic field $H_{ex}$.

FIG. 3A shows the case where the direct current $I_{dc}$ was 0, FIG. 3B shows the case where the direct current $I_{dc}$ was 25 mA, and FIG. 3C shows the case where the direct current $I_{dc}$ was −25 mA. In each of these graphs, the horizontal axis represents the externally applied magnetic field $H_{ex}$ (Oe), and the vertical axis represents the amplitude E (mV) of the output voltage of the amorphous wire.

The $Co_{72.5}Si_{12.5}B_{15.0}$ amorphous wire (diameter: 130 $\mu$m) was manufactured by an in-water super quick cooling method, and used as is.

Since the E-$H_{ex}$ characteristic becomes asymmetric by the supply of the direct current $I_{dc}$, as is apparent from FIGS. 3A–3C, it is understood that the direct current $I_{dc}$ produces a bias magnetic field.

In addition, the sensitivity ($|\partial E/\partial H_{ex}|$), which is manifested as an increase in the amplitude E of the output voltage with respect to an increase in the externally applied magnetic field $H_{ex}$, becomes 5 fold or more compared to that in the characteristic curve shown in FIG. 3A. From this, it is understood that the direct current $I_{dc}$ has an effect of increasing the sensitivity as well as the effect of providing the bias. When $H_\theta+H_{ex}=0$, variations in the AC magnetic flux in the direction of the spiral magnetic anisotropy becomes maximum due to symmetrical magnetic domain-wall vibration, so that the amplitude E of the above-described output voltage becomes maximum.

Figure 4:
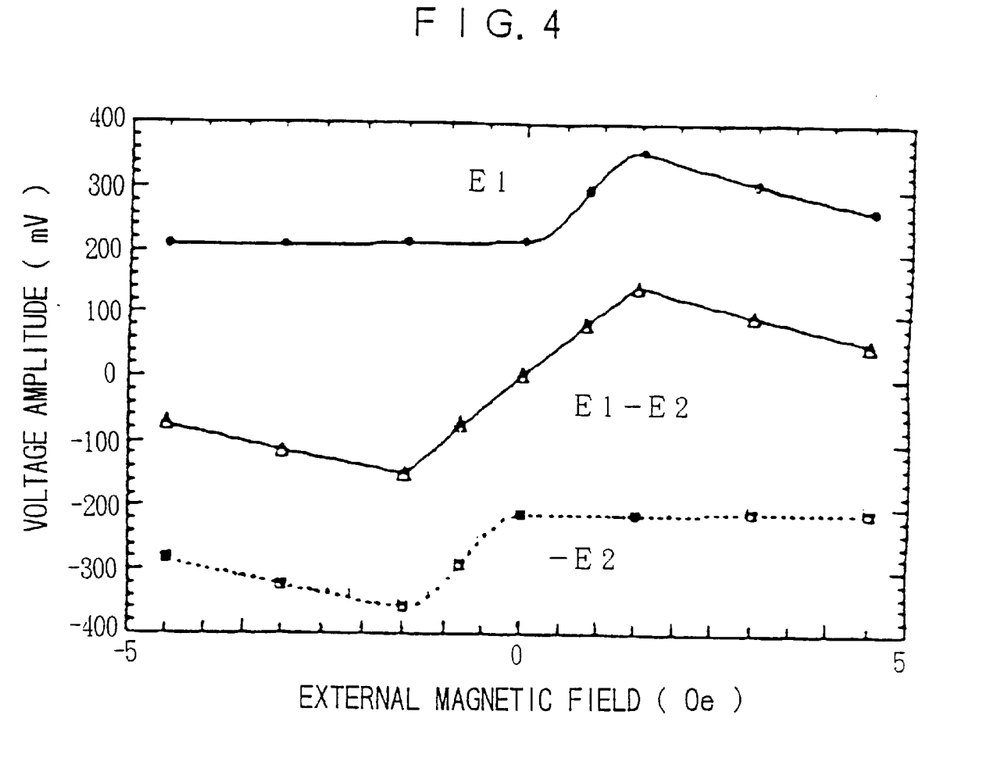
FIG. 4 is a graph showing the characteristics of paired twisted MI elements according to the first embodiment of the present invention in which the relationship between an externally applied magnetic field and a difference between the output voltages of the paired elements is shown.

FIG. 4 shows the characteristics of paired twisted MI elements according to the first embodiment of the present invention in which the relationship between an externally applied magnetic field and a difference $E_o$ between the output voltages of the paired twisted elements MI is shown. It is shown that when two twisted MI elements having the characteristics of FIGS. 3A and 3B, respectively, are used, the difference Eo between the output voltages of the MI elements varies in direct proportion to the externally applied magnetic field $H_{ex}$, and that the paired twisted MI elements can operate as a magnetic sensor having a high sensitivity.

Figure 5:
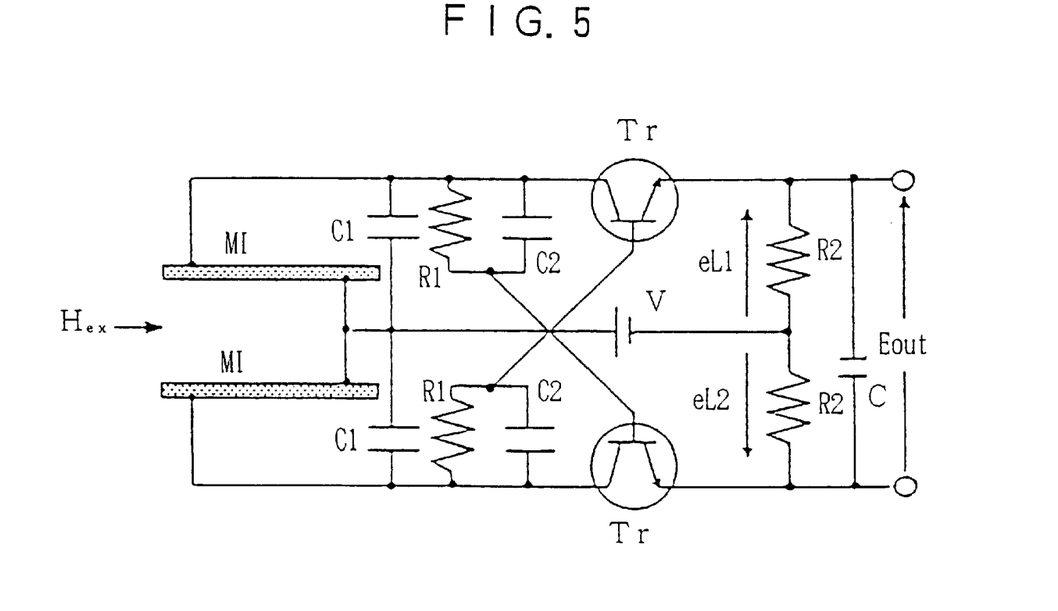
FIG. 5 is a circuit diagram showing a magnetic sensor in which the paired MI elements according to the first embodiment and two transistors form a multivibrator oscillating circuit.

FIG. 5 shows a magnetic sensor in which the paired twisted MI elements having the characteristics shown in FIG. 4 and two transistors form a multivibrator oscillating circuit.

In this circuit, a half-wave rectified current flows through the two twisted MI elements due to the rectifying operation of the transistors, so that a biasing effect is provided. When the collectors of the two transistors are connected together via a capacitor, the oscillation circuit operates as a resonant multivibrator, which can be used as a magnetic sensor consuming a reduced amount of electrical power. Since both the oscillation circuits can be operated using a single DC voltage source, the structure of the sensor heads can be greatly simplified.

Embodiment 2

Figure 6:
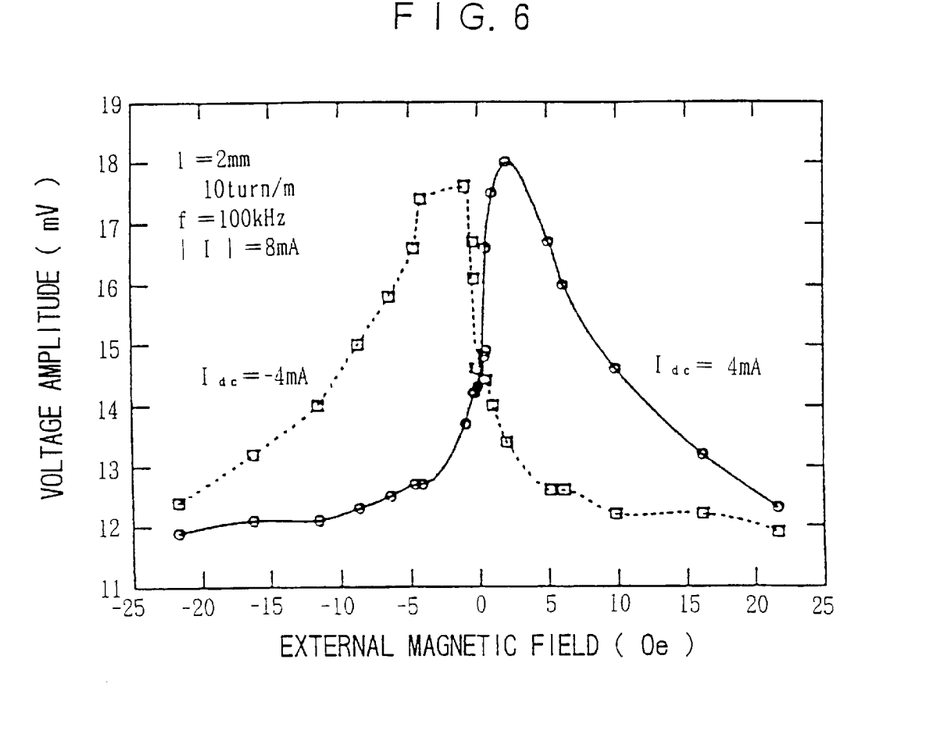
FIG. 6 is a graph showing the characteristics of an MI element according to a second embodiment of the present invention in which the relationship between an externally applied magnetic field and the amplitude of an output voltage is shown.

FIG. 6 shows the E-$H_{ex}$ characteristic of an MI element according to a second embodiment of the present invention in which the relationship between an externally applied magnetic field and the amplitude of an output voltage is shown. In FIG. 6, the horizontal axis represents an externally applied magnetic field $H_{ex}$ (Oe), and the vertical axis represents the amplitude E (mV) of an output voltage. An $Fe_{4.5}Co_{68}Si_{12.5}B_{15}$ amorphous wire was subjected to wire drawing so as to have a diameter of 50 $\mu$m and a length of 10 cm and then tension annealed. The annealed wire was twisted one turn and was subjected to joule heat treatment by supplying a current of 600 mA for 20 seconds. The wire thus obtained was cut into a length of 2 mm so as to obtain an MI element. FIG. 6 shows the E-$H_{ex}$ characteristic of the MI element thus obtained. From this, it is understood that a spiral magnetic anisotropy due to the twist and heat treatment is remained.

Embodiment 3

Next, a third embodiment of the present invention will be described.

Figure 7:
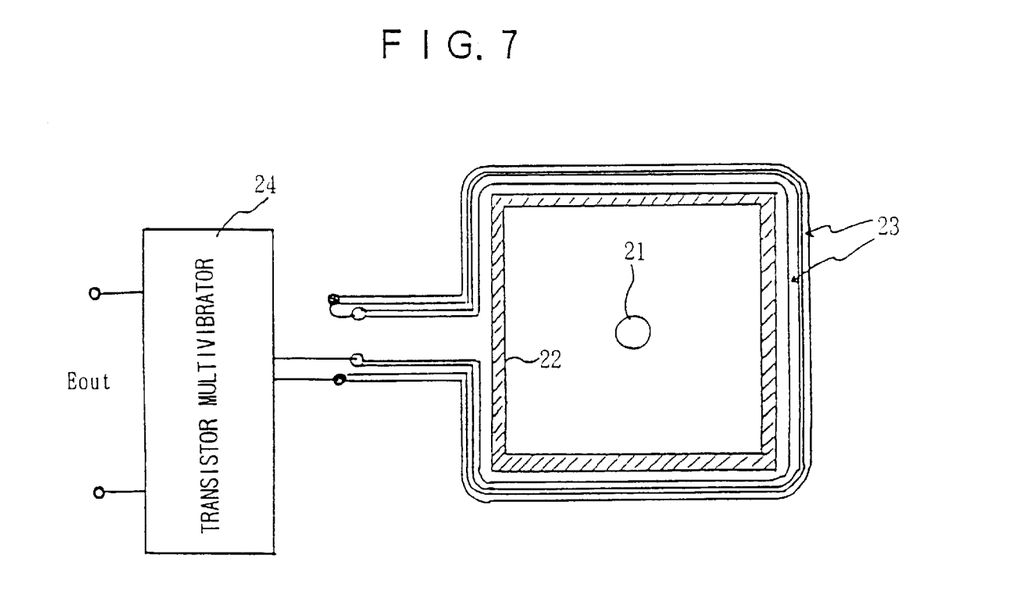
FIG. 7 is a diagram showing a third embodiment of the present invention in which paired MI elements are used in a non-contact current sensor for an electrical power line.

FIG. 7 shows a third embodiment of the present invention in which paired MI elements are used in a non-contact current sensor for an electrical power line.

In FIG. 7, numeral 21 denotes a conductor (power line), numeral 22 denotes an insulating box, numeral 23 denotes amorphous wires, and numeral 24 denotes a transistor multivibrator sensor. The industrial current detecting sensor of the present embodiment for industrial use has a rated current of 400 A (60 Hz) and can bear a surge current of 2000–4000 A.

As shown in FIG. 7, two amorphous wires 23 which are similar to that of the first embodiment and which have a length of 100 cm are disposed around the insulating box 22 measuring 30 cm×30 cm. These wires 23 can detect the magnitude of the current flowing through the conductor 21 while cancelling errors due to variations in the position of the conductor 21. The two wires 23 and two transistors can form a multivibrator as shown in FIG. 5.

Due to the above-described structure, the structure of the sensor head can be simplified, and it is possible to provide a portable current sensor for large electrical power.

Embodiment 4

Next, a fourth embodiment of the present invention will be described.

Figure 8:
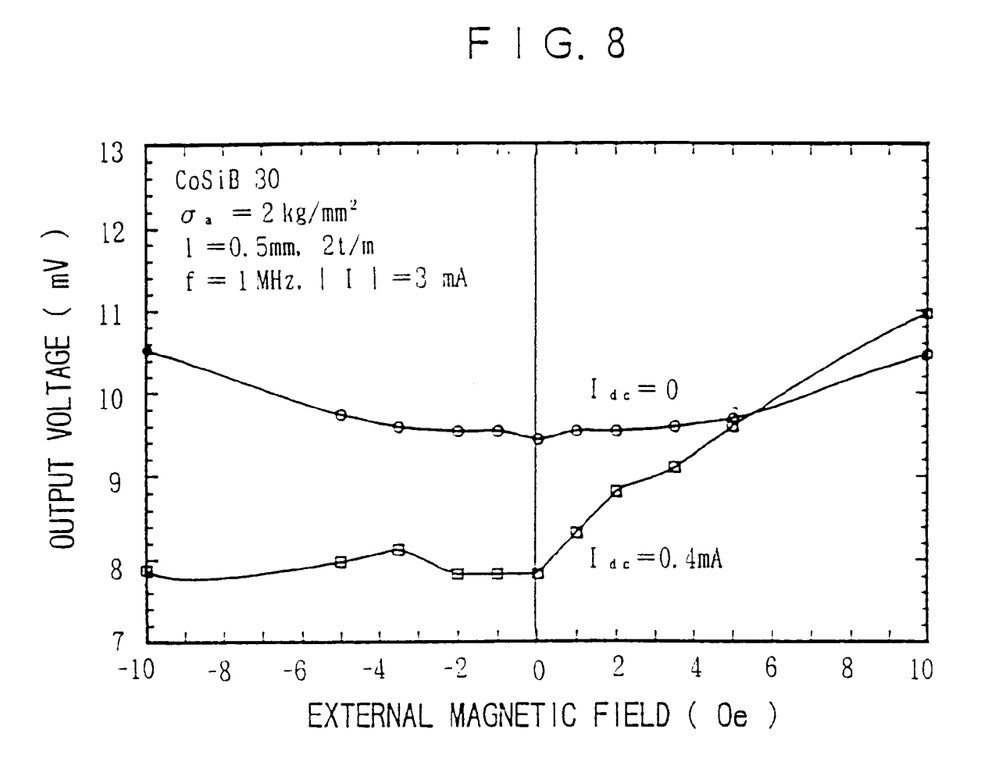
FIG. 8 is a graph showing the characteristics of an MI element according to a fourth embodiment of the present invention in which the relationship between an externally applied magnetic field and the amplitude of an output voltage is shown.

FIG. 8 shows the characteristics of an MI element according to a fourth embodiment of the present invention in which the relationship between an externally applied magnetic field and the amplitude of an output voltage is shown. A CoSiB amorphous wire was subjected to wire drawing so as to have a diameter of 30 μm. Subsequently, the wire was heated at 475° C. for one minute in a state in which a tension of 2 kg/mm$^2$ was applied to the wire, and was then rapidly cooled in the air. The wire had a length of about 0.5 mm. FIG. 8 shows the magneto-impedance characteristic of the MI element thus manufactured. The CoSiB amorphous wire was twisted by two turns per meter. Both ends of the element were fixed by soldering. A current of 3 mA having a frequency of 1 MHz was supplied to the wire while applying an external magnetic field $H_{ex}$ in the longitudinal direction of the wire, and the doubled value $V_o$ of the amplitude of an output voltage induced between both ends of the wire was measured.

When the direct current $I_{dc}$ superposed on the alternating current was zero, the MI element exhibited a symmetrical magneto-impedance characteristic. When the direct current $I_{dc}$ was 0.4 mA, the MI element exhibited an asymmetrical magneto-impedance characteristic. When $H_{ex}<0$, the value $V_o$ was substantially constant. When $H_{ex}>0$, the value $V_o$ increased in proportion to $H_{ex}$. The value $V_o$ increased until $H_{ex}$ became substantially equal to 10 Oe. That is, the MI element exhibited characteristics suitable for constituting a current sensor. When both a twist and a direct current $I_{dc}$ were applied to the MI element, the gradient of $V_o/H_{ex}$ increased to about four times in the region of $H_{ex}>0$, so that the sensitivity of the MI element was increased.

In the above described embodiments, a high frequency current on which a direct current is superposed is supplied to a thin magnetic material having a spiral magnetic anisotropy. However, a pulse current may be used instead of the high frequency current. Even in this case, similar effects can be obtained.

As described above, the present invention can provide a novel magneto-impedance element which has a reduced size, and which has a high sensitivity and a high response speed. Especially, use of the magneto-impedance element makes it possible to obtain a micro-sized sensor head and to facilitate adjustment.

The present invention is not limited to the above-described embodiments. Numerous modifications and variations of the present invention are possible in light of the spirit of the present invention, and they are not excluded from the scope of the present invention.

What is claimed is:

1. An apparatus for magnetic sensing comprising:

(a) a thin magnetic wire having a spiral magnetic anisotropy produced by twisting; and (b) a current supply source for supplying to said thin magnetic wire a dc-biased alternating current so as to produce a voltage across said thin magnetic wire, the amplitude of said voltage asymmetrically varying with a variation in an externally applied magnetic field.

2. An apparatus for magnetic sensing according to claim 1, wherein said dc-biased alternating current is a dc-biased high frequency current.

3. An apparatus for magnetic sensing according to claim 1, wherein said dc-biased alternating current is a dc-biased pulse current.

4. An apparatus for magnetic sensing according to claim 1, wherein said thin magnetic material is formed of an amorphous magnetic material.

5. An apparatus for magnetic sensing according to claim 4, wherein said amorphous magnetic material is an amorphous wire having a diameter equal to or less than 100 μm.

6. A method for magnetic sensing comprising the steps of:

(a) providing a thin magnetic wire having a spiral magnetic anisotropy produced by twisting; and (b) supplying to said thin magnetic wire a dc-biased alternating current so as to produce a voltage across said thin magnetic wire, the amplitude of said voltage asymmetrically varying with a variation in an externally applied magnetic field.

* * * * *

UNITED STATES PATENT AND TRADEMARK OFFICE
CERTIFICATE OF CORRECTION

PATENT NO. : 5,994,899
DATED : November 30, 1999
INVENTOR(S) : Kaneo Mohri

Page 1 of 1

It is certified that error appears in the above-identified patent and that said Letters Patent is hereby corrected as shown below:

<u>Column 2,</u>
Line 15, "$10_{-5}$" should read -- $10^{-5}$ --.

<u>Column 4,</u>
Line 66, "$H_{74}$" should read -- $H_\theta$ --.

Signed and Sealed this

Sixth Day of November, 2001

*Attest:*

*Attesting Officer*

NICHOLAS P. GODICI
*Acting Director of the United States Patent and Trademark Office*